United States Patent [19]
Baker et al.

[11] Patent Number: 6,101,130
[45] Date of Patent: Aug. 8, 2000

[54] SEMICONDUCTOR DEVICE MEMORY CELL AND METHOD FOR SELECTIVELY ERASING THE SAME

[75] Inventors: Frank Kelsey Baker; Juan Buxo; Danny Pak-Chum Shum; Thomas Jew, all of Austin, Tex.

[73] Assignee: Motorola Inc., Schaumburg, Ill.

[21] Appl. No.: 09/342,470

[22] Filed: Jun. 29, 1999

[51] Int. Cl.[7] .................................................. G11C 11/34
[52] U.S. Cl. ........................................ 365/185.29; 365/63
[58] Field of Search ................................ 365/185.29, 63

[56] References Cited

U.S. PATENT DOCUMENTS

| | | | |
|---|---|---|---|
| 4,408,306 | 10/1983 | Kuo ......................................... | 365/218 |
| 5,047,981 | 9/1991 | Gill et al. ................................. | 365/185 |
| 5,339,279 | 8/1994 | Toms et al. .............................. | 365/185 |
| 5,357,476 | 10/1994 | Kuo et al. ................................ | 365/218 |

*Primary Examiner*—Trong Phan
*Assistant Examiner*—M. Tran
*Attorney, Agent, or Firm*—Robert A. Rodriguez; George R. Meyer

[57] ABSTRACT

An electrically erasable programmable read only memory (EEPROM) array (30) that includes rows and columns of memory cells. Word lines (WL0 and WL1) are substantially parallel to each other and extend in a first direction. Drain bit lines (BL0–B13) and source lines (SL0 and SL1) are substantially parallel to each other and extend in a second direction that is perpendicular to the first direction. The source line (SL0) and source regions of at least two memory cells (31 and 36) within the EEPROM array are electrically connected by a first source local interconnect (LI1). The first source local interconnect (LI1) has a length that extends substantially in the first direction and electrically connects some, but not all, of the memory cells lying within the EEPROM array (30).

20 Claims, 4 Drawing Sheets

SEMICONDUCTOR DEVICE MEMORY CELL AND METHOD FOR SELECTIVELY ERASING THE SAME

FIELD OF THE INVENTION

The present invention relates generally to semiconductor devices, and more particularly, to semiconductor devices having memory cells and methods of erasing the memory cells.

1. Related Applications

This application is related to U.S. patent application Ser. No. 08/997,714, entitled "Semiconductor Device, Memory Cell and Processes for Forming Them," filed on Dec. 23, 1997, and "Semiconductor Device and a Method of Operating the Same," (Attorney Docket No. SC91054A) filed of even date. These two applications are assigned to the current assignee hereof and are incorporated herein by reference.

2. Related Art

Conventional NOR-type flash Electrically Erasable Programmable Read Only Memory (EEPROM) architectures typically use a source line that extends in a direction that is substantially parallel to the word lines within a memory array. FIG. 1 illustrates eight memory cells symmetrically oriented about a common source line S in a memory array 10. As shown in FIG. 1, memory cells 11, 12, 13, and 14 lie below the common source line S, and memory cells 16, 17, 18 and 19 lie above the common-source line S. In addition, the memory array 10 includes two rows of word lines WL0 and WL1 and four columns of drain bit lines BL0, BL1, BL2, and BL3.

Memory cells in the memory array 10 are programmed and erased by applying appropriate biasing potentials to the common-source line S, the drain bit lines BL0, BL1, BL2, and BL3, and the word lines WL0 and WL1. However, this memory array configuration does not allow specific memory cells associated with the common source line S to be erased without erasing all of the memory cells associated with the common source line S.

One method for overcoming this limitation includes using additional circuitry, commonly referred to as an EEPROM emulation memory array or emulation block, in conjunction with flash EEPROM memory array. Shown in FIG. 2 is an illustration of a memory module 20 having an emulation block 26. The memory module 20 further includes a main memory array 22 that is formed from individual memory blocks 24. The emulation block 26 is formed as a separate array, apart from the main memory array, and allows selected memory cells within the memory blocks 24 to be programmed and erased without disturbing other memory cells. However, the emulation memory array increases the area requirement of the semiconductor device as well as its complexity of fabrication.

Using a two-transistor (2T) EEPROM design layout is an alternative method for overcoming these limitations. The 2T EEPROM design layout is similar to the NOR-type flash layout of FIG. 1. However, it uses additional isolation transistors between the floating gate and drain of each memory cell in the memory array. The isolation transistors protect the unselected memory cells during the program and erase operations. Although this method provides greater protection to the unselected memory cells, each memory cell now has two transistors instead of one and the cell size and layout requirements for the memory array are increased.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

In accordance with an embodiment of the present invention, a semiconductor device includes an array having rows and columns of EEPROM cells. The array includes word lines that have lengths that are substantially parallel to each other and extend in a first direction. The array further includes drain bit lines and first and second source lines that have lengths that are substantially parallel to each other and extend in a second direction, the second direction being perpendicular to the first direction. One of the first or second source lines and the source regions of at least two memory cells are electrically connected by a first source local interconnect that extends in the first direction. The at least two memory cells share a common row or column, and the first source local interconnect electrically connects some but not all of the memory cells sharing a common row or column.

Figure 3:
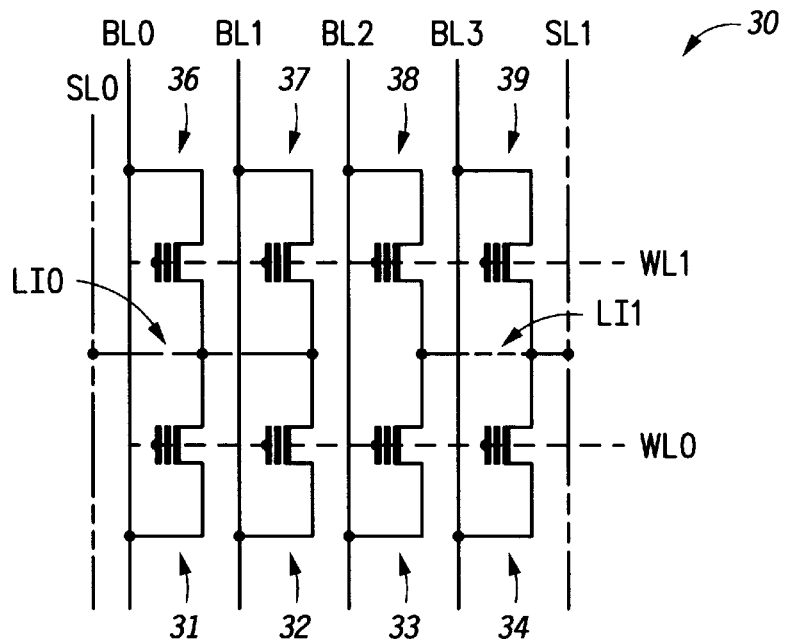
FIG. 3 includes a circuit schematic of a flash memory array in accordance with an embodiment of the present invention.

FIG. 3 includes a circuit schematic of a portion of a semiconductor device EEPROM array 30. The memory array 30 includes memory cells 31, 32, 33, 34, 36, 37, 38 and 39. Each memory cell has a source and drain region lying within a common well region (not shown) and a control gate. The electrical connections and orientations are as follows. The source lines SL0 and SL1 and drain bit lines BL0, BL1, BL2 and BL3 lie along columns that have lengths that run substantially parallel to each another. The word lines WL0 and WL1 lie along rows that have lengths that are substantially parallel to each other and substantially perpendicular to the source lines SL0 and SL1 and the drain bit lines BL0, BL1, BL2 and BL3. The source line SL0 is electrically connected to the source regions of memory cells 31, 32, 36 and 37 via a source local interconnect LI0. The source line SL1 is electrically connected to the source regions of memory cells 33, 34, 38, and 39 via a second source local interconnect LI1. In accordance with an embodiment of the present invention, the source local interconnects LI0 and LI1 are oriented such that they have lengths that extend in a direction that is parallel to the word lines WL0 and WL1. Drain bit line BL0 is electrically connected to the drains of memory cells 31 and 36, drain bit line BL1 is electrically connected to the drains of memory cells 32 and 37, drain bit line BL2 is electrically connected to the drains of memory cells 33 and 38, and drain bit line BL3 is electrically connected to the drains of memory cells 34 and 39. Portions of word line WL0 form or electrically contact the control gates of memory cells 31 32, 33, and 34, and portions of WL1 form or electrically contact the control gates of memory cells 36, 37, 38, and 39.

Figure 4:
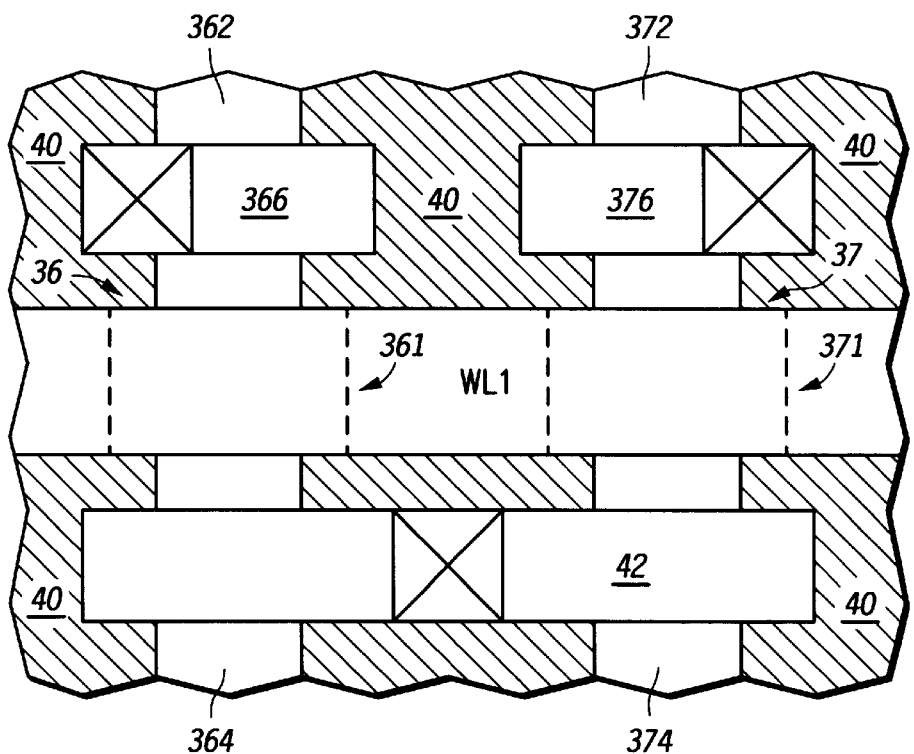
FIG. 4 includes an illustration of a layout view of two memory cells within the memory array illustrated in FIG. 3.

FIG. 4 includes an illustration of a layout view of memory cells 36 and 37 in accordance with one embodiment of the present invention. Although other layouts are possible, this specific layout is presented for the purposes of illustration. The memory cell 36 includes a diffused drain region 362 and a diffused source region 364, each lying within a well region (not shown). A drain contact plug 366 electrically connects the drain region 362 to the drain bit line BL0 (not shown) at the ☒ illustrated in FIG. 4. Memory cell 37, similarly has a diffused drain region 372, a diffused source region 374, and a drain contact plug 376 that electrically connects the drain region 372 to the drain bit line BL1 (not shown) at the ☒ illustrated in FIG. 4.

In this particular embodiment, a source local interconnect 42 electrically connects the source regions 364 and 374 and the source regions of memory cells 31 and 32 (not shown in FIG. 4) to one another. The source local interconnect 42 extends over portions of the field isolation region 40 and is typically formed within 50 nanometers of it. In one embodiment, the source local interconnect 42 is formed using a conductive material, such as tungsten. In other embodiments, other conductive materials could be used including polysilicon, a silicide, a metal nitride, or the like.

Although not shown in FIG. 4, BL0, SL0, and BL1 are metal-containing interconnects formed over the memory cells 36 and 37. BL0, SL0 and BL1 have lengths that are substantially perpendicular to the length of word line WL1. BL0 electrically connects to the drain region of memory cell 36, BL1 electrically connects to the drain region of memory cell 37, and SL0 electrically connects to the source region of both of the memory cells 36 and 37, each at the respective ☒ locations shown in FIG. 4.

The word line WL1 extends across portions of the active regions that separate the drain regions 362 and 372 from their corresponding source regions 364 and 374. Floating gates 361 and 371 lie beneath WL1 and are associated with memory cells 36 and 37, respectively. These floating gates are electrically isolated from each other.

Embodiments of the present invention describe the erasing and programming of memory cells via a Fowler-Nordheim (F-N) tunneling mechanism to affect a charge of memory cell's floating gate. Alternatively, other charging mechanisms such as Hot Electron Injection (HEI) could be used to erase and program the memory cells.

Referring to FIG. 3, an embodiment discussing how memory cells 36 and 37 are erased without significantly disturbing data in memory cells 31, 32, 33, 34, 38, and 39 will now be described. In one such embodiment, the memory array well region (not shown) is biased at a potential less (more negative) than approximately −2 volts (V). More particularly, the well region is biased in a range of approximately −5V to −9V. The selected word line WL1 is biased in a range of approximately +8V to +15V, and the unselected word line WL0 is biased in a range of approximately 0 to −2V. The selected drain bit lines BL0 and BL1 are biased at a potential that is substantially the same as that of the well regions, and the unselected drain bit lines BL2 and BL3 are biased at a potential that is approximately 6–9 volts higher than that of the well region.

In one embodiment, the selected and unselected source lines SL0 and SL1 may both electrically float. The potential of SL0 will then eventually stabilize at a potential close to that of BL0 and BL1. Similarly, the potential of SL1 will eventually stabilize at a potential close to that of BL2 and BL3. If necessary, conventional peripheral circuitry (e.g. switch capacitor banks) may be used to pre-charge the source lines SL0 and SL1 to within a specified potential range prior to electrically floating them.

These biasing conditions exceed the minimum tunneling threshold potential for electrons associated with selected memory cells 36 and 37 to tunnel from the substrate into their respective floating gates, thereby erasing them to a high threshold voltage (VT) state. The unselected memory cells 31–34, 38, and 39 are relatively undisturbed when erasing memory cells 36 and 37 because the biasing conditions do not exceed their respective minimum threshold tunneling potentials. As used in this specification, the minimum threshold tunneling potential is the set of potential conditions associated with the minimum electrical field, across a dielectric, at which electron tunneling becomes significant. The dielectric may lie between the floating gate and the substrate (tunnel dielectric) or between the floating gate and the control gate of the memory cell. For a conventional silicon dioxide dielectric, the minimum electric field or electric field threshold is approximately 7.0 megavolts per centimeter (MV/cm). The minimum electric field can vary depending on the dielectric material.

In a memory cell having a tunnel dielectric with a thickness of approximately 10 nanometers, a potential greater than approximately 7V appearing across the tunnel dielectric will exceed the 7.0 MV/cm minimum electric field. Assuming approximately 60% of the bias potential supplied by the selected word line appears across the tunnel dielectric, then a bias potential of approximately 11.7V applied between the control gate and the substrate will produce significant tunneling.

In accordance with one embodiment of the present invention, the potential difference between the word line WL1 and the source/drain/channel regions of the selected memory cells 36 and 37 is between approximately 10V to 20V. The potential difference between the word lines and the active regions of the unselected memory cells is less than approximately 10V. The potential difference used for a selected memory cell should differ from the voltage potential used for an unselected memory cell by at least approximately 5V. However, this potential difference is subject to scaling as the magnitude of the biasing potential changes to accommodate smaller and larger semiconductor devices.

A specific embodiment is now described, as an example, to illustrate the erasing operation. In accordance with an embodiment of the present invention, a memory cell is erased (selected) when its corresponding word line, drain bit line and source line are all selected, thereby shifting the threshold voltage of the memory cell to a high VT state. If any one or more of the memory cell's word line, drain bit line, or source line is unselected, the VT of the memory cell is not significantly changed and the memory cell is not erased (unselected). In this particular embodiment, unselected word line WL0 is biased at 0V and selected word line WL1 is biased at approximately +12V. Selected drain bit lines BL0 and BL1 are biased at approximately −5V, and unselected drain bit lines BL2 and BL3 are biased at approximately +3V. Selected source line SL0 is biased at approximately −5V, and unselected source line SL1 is biased at approximately +3V. The well region (not shown) for the entire set of memory cells, illustrated in FIG. 3, is biased at approximately −5V.

Under these biasing conditions, the potential difference between the selected word line WL0 (approximately +12V) and the active regions associated with the selected source line SL0 and the selected drain bit lines BL0 and BL1 (approximately −5V) is approximately 17V. Assuming that 60% of the bias supplied by the word line appears across the 10 nanometer tunnel dielectric, as described previously, an electric field of approximately 10.2 MV/cm will appear across the tunnel dielectric of the selected memory cells. This value exceeds the 7.0 MV/cm electric field threshold. Therefore, electrons can tunnel from the substrate into the selected memory cell's floating gate and erase the memory cell to a high VT state.

Unselected memory cells 38 and 39, which are also associated with selected word line WL1, are not erased because the potential difference between the selected word line WL0 (approximately +12V) and the active regions associated with the unselected source line SL1 and the unselected drain bit lines BL2 and BL3 (approximately +3V) is only approximately 9V. Again, assuming that 60% of the bias supplied by the word line appears across the 10 nanometer tunnel dielectric, the applied electric field will only be approximately 5.4 MV/cm, which is less than the 7.0 MV/cm electric field threshold.

Similarly for unselected memory cells 31 and 32 the potential difference between the unselected word line WL0 (approximately 0V) and active regions associated with the selected source line SL0 and selected bit lines BL0 and BL1 (approximately −5V) is only approximately 5V. And, for unselected memory cells 33 and 34 the potential difference between the unselected word line WL0 and active regions associated with the unselected source line SL1 and unselected bit lines BL2 and BL3 (approximately +3V) is only approximately 3V. Therefore, under the previously stated conditions, the electric fields applied across the tunnel dielectrics of these memory cells are only approximately 3.0 MV/cm and 1.8 MV/cm, respectively. Both of which are less than the 7.0 MV/cm electric field threshold.

Figure 5:
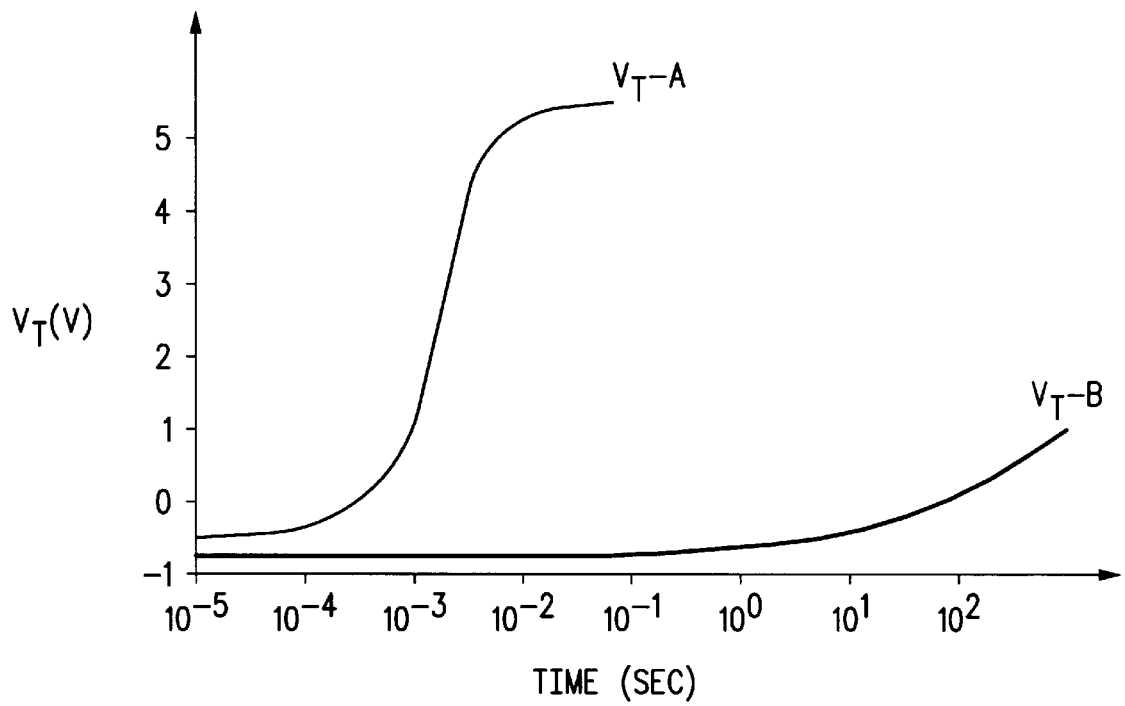
FIG. 5 includes a plot of threshold voltage versus stress time for an unselected memory cell that is adjacent to and shares a common word line with a selected memory cell.

FIG. 5 is a plot comparing changes in threshold voltage versus stress time for selected and unselected memory cells sharing a common selected word line. The memory cells are stressed using potentials described in FIG. 3 to erase memory cells 36 and 37. VT-A is a measure of the threshold voltage change that occurs over time to a selected memory cell (36 or 37) when applying approximately +12V to the control gate and approximately −5V to the drain bit line. As shown in FIG. 5, a change in threshold voltage corresponding to an erasing of the memory cell occurs after approximately $10^{-3}$ seconds (1 msec) of stressing. This in comparison to VT-B, which is a measure of the threshold voltage change that occurs over time to an unselected memory cell (38 or 39) when applying approximately +12V to the control gate and approximately +3V to the drain bit line. As indicated by FIG. 5, no appreciable change in VT-B occurs, relative to VT-A, until after approximately 10 seconds of stressing.

Figure 6:
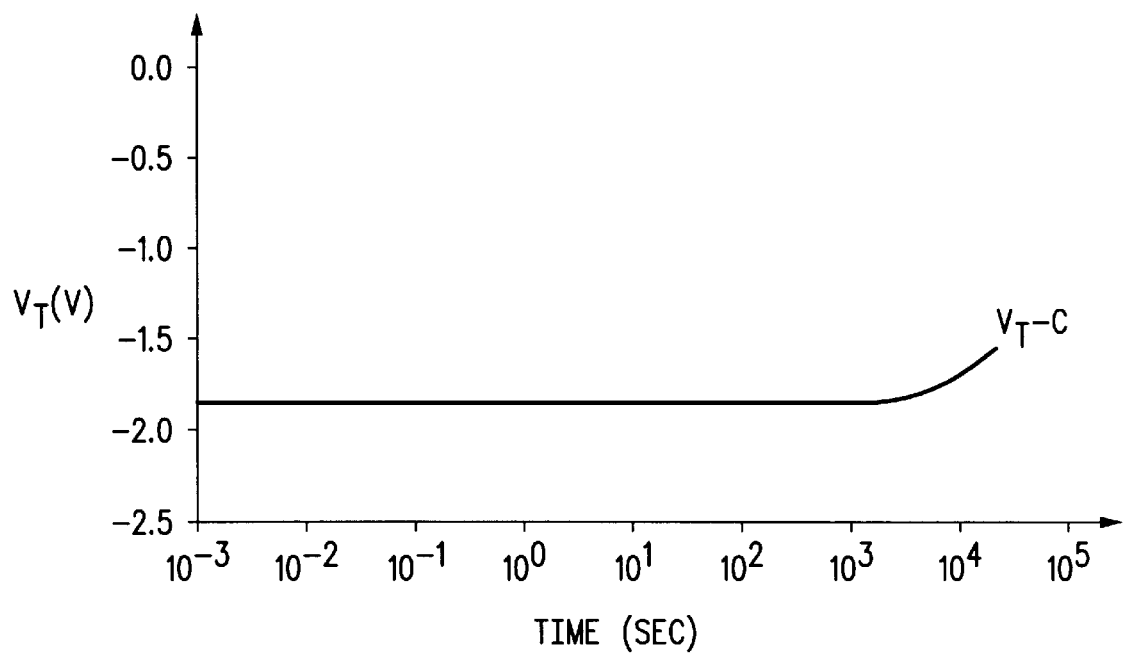
FIG. 6 includes a plot of threshold voltage versus stress time for an unselected memory cell that is adjacent to and shares a common drain bit line with a selected memory cell.

Similarly, FIG. 6 is a plot illustrating threshold voltage versus stress time changes for an unselected memory cell (31 or 32) having a common drain bit line with a selected memory cell (36 or 37). The unselected memory cell is stressed using potentials described in FIG. 3 to erase memory cells 36 and 37. Specifically, VT-C measures threshold voltage changes that occur to an unselected memory cell (31 or 32) when applying 0V to the control gate and approximately −5V to the drain bit line. As indicated by FIG. 6, no appreciable change in the threshold voltage of the unselected memory cell (31 or 32) occurs until after approximately 1000 seconds of stressing has elapsed.

Therefore, as indicated by FIGS. 5 and 6, the time to erase a selected memory cell (36 or 37) occurs approximately 10,000 faster than the time it takes to appreciably change the threshold voltage of unselected memory cells sharing a common word line or drain bit line. These plots indicate that the unselected memory cells 31,32, 38, and 39 demonstrate a substantial degree of immunity to an erase-disturb of the selected memory cells 36 and 37. In either case, as illustrated by FIGS. 5 and 6, many erase cycles can be performed on selected memory cells without disturbing the threshold voltage of adjacent unselected memory cells.

Programming and reading of the memory cells are accomplished using conventional methods. For example, to program memory cell 36, drain bit line BL0 is biased at approximately +5V, word line WL1 is biased at approximately −9V and the source lines SL0 and SL1 electrically float. These biasing potentials result in an electric field, across the dielectric separating the floating gate and substrate, that is greater than approximately 7.0 MV/cm. Therefore, electrons are ejected from the memory cell's floating gate into its drain, thereby programming the memory cell to a low VT state.

The biasing conditions for the remaining memory cells 31, 32, 33, 34, 37, 38, and 39 are such that the memory cells remain substantially undisturbed during the programming operation. Drain bit lines BL1, BL2, and BL3 are biased at a potential of 0V, and word line WL0 is biased at a potential of 0V. Therefore, the potential difference between the bit line BL0 and the word line WL0 of memory cell 31 is approximately 5V, the potential difference between drain bit lines BL1, BL2 and BL3 and the word line WL0 of memory cells 32, 33 and 34 is approximately 0V, and the potential difference between drain bit lines BL1, BL2 and BL3 and the word line WL1 of memory cells 37, 38 and 39 is approximately 9V. These potential differences produce an electric field, across the dielectric separating the floating gate and substrate, that is less than approximately 7.0 MV/cm. Therefore, the memory cells remain relatively undisturbed by the programming operation.

Memory arrays typically have word lengths that correspond to multiples of 8-bits (8, 16, 32, 64-bits, etc.) Word eraseability is achieved by connecting a source local interconnect from the source line to a number of rows of memory cells corresponding to the bit length of a word. The layout and design determines the minimum number of cells that can be erased at any one time.

Depending on the memory architecture, the number of memory cells sharing the source local interconnect can be configured to correspond to erasing a word length of memory. For example, in the case of an 8-bit architecture, eight memory cells sharing the source local interconnect would correspond to a single word length. Similarly, in the case of a 16-bit, 32-bit or 64-bit architecture, 16, 32 or 64 memory cells, respectively, sharing the source local interconnect, correspond to a single word length. Alternatively, in the case of an 8-bit architecture that uses a parity bit, nine memory cells sharing a common source would correspond to a single word length.

In addition, if so desired, specific source lines, drain bit lines and word lines can be biased, as necessary, to erase an entire section of memory cells in the memory array. In this manner, a page erase of a column of memory cells, such as 36, 37, 38 and 39, illustrated in FIG. 3, or an erase of the entire memory array 30, can occur during a single erasing operation.

Figure 7:
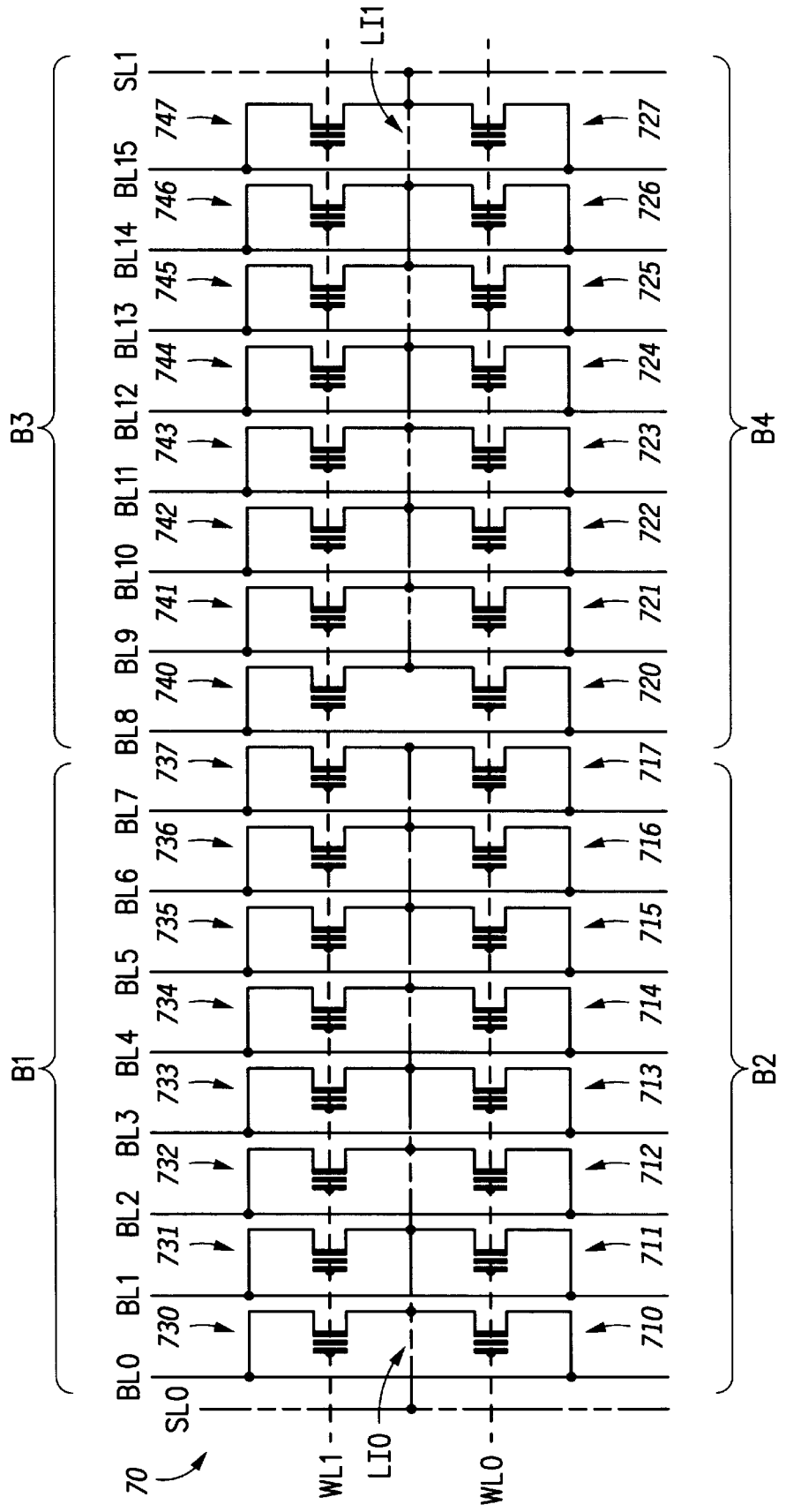
FIG. 7 includes an illustration of a circuit schematic illustrating an alternate embodiment of the present invention.

FIG. 7 includes an alternate embodiment of the present invention illustrating a memory array 70 where a byte of data is erased during one operation. The electrical connections and orientations of elements in the memory array are as follows. The source lines SL0 and SL1 and the drain bit lines BL0–BL15 have lengths that all run substantially parallel to one another. The word lines WL0 and WL1 and source local interconnect lines LI0 and LI1 have lengths that are substantially perpendicular to the source lines and the drain bit lines. SL0 is electrically connected to the source regions of memory cells 710–717 and 730–737, via the source local interconnect LI0. SL1 is electrically connected to the source regions of memory cells 720–727 and 740–747, via the source local interconnect line LI1.

In this particular memory array, eight memory cells share a common word line and source local interconnect line to form memory blocks that correspond to a byte of memory. Memory cells 730–737 form a memory block B1, memory cells 710–717 form a memory block B2, memory cells 740–747 form a memory block B3, and memory cells 720–727 form a memory block B4.

BL0 is electrically connected to the drain regions of memory cells 710 and 730. BL1 is electrically connected to the drain regions of memory cells 711 and 731. BL2 is electrically connected to the drain regions of memory cells 712 and 73 2. BL3 is electrically connected to the drain regions of memory cells 713 and 733. BL4 is electrically connected to the drain regions of memory cells 714 and 734. BL5 is electrically connected to the drain regions of memory cells 715 and 735. BL6 is electrically connected to the drain regions of memory cells 716 and 736, and BL7 is electrically connected to the drain regions of memory cells 717 and 737.

BL8 is electrically connected to the drain regions of memory cells 720 and 740. BL9 is electrically connected to the drain regions of memory cells 721 and 741. BL10 is electrically connected to the drain regions of memory cells 722 and 742. BL11 is electrically connected to the drain regions of memory cells 723 and 743. BL12 is electrically connected to the drain regions of memory cells 724 and 744. BL13 is electrically connected to the drain regions of memory cells 725 and 745. BL14 is electrically connected to the drain regions of memory cells 726 and 746, and BL15 is electrically connected to the drain regions of memory cells 727 and 747.

Portions of WL0 form or electrically contact the control gates for memory cells 710–717 and 720–727. Portions of WL1 form or electrically contact the control gates for memory cells 730–737 and 740–747.

A specific embodiment is now described, as an example, to illustrate the erasing operation for selected memory cells 730–737. These cells comprise a single byte of data. In this particular embodiment, WL0 is biased at approximately 0V, and WL1 is biased at approximately +12V. BL0–BL7 are biased at approximately –5V, and BL8–BL15 are biased at approximately +3V. SL0 is biased at approximately –5V, and SL1 is biased at approximately +3V. The well region for the entire set of memory cells, illustrated in FIG. 7, is biased at approximately –5V.

Under these biasing conditions, the minimum tunneling threshold potential is exceeded for selected memory cells 730–737. Therefore electrons can tunnel from the substrate into their respective floating gates and erase these memory cells to a high threshold voltage (VT) state The other memory cells associated with WL1 (memory cells 740–747) are not erased because the minimum tunneling threshold potential for these memory cells is not exceeded. Similarly, the minimum tunneling threshold potential for the remaining unselected memory cells 710–717 and 720–727 is less than that necessary to erase them. The programming and reading of memory cells in the memory array 70 is performed using conventional methods.

Multiple memory blocks can be page erased using the techniques herein described. For example, in an alternate embodiment, memory cells corresponding to two adjacent memory blocks B1 and B2, having different word lines, can be selectively erased using the biasing conditions previously described to erase memory cells 730–737. Similarly, the two memory blocks BL1 and BL3, sharing a same word line, can also be selectively erased using the biasing conditions previously described to erase memory cells 730–737.

Embodiments of the present invention disclose a cell layout that allows specific flash EEPROM memory cells to be selectively erased. Application of these embodiments can be useful in a variety of products, including stand-alone memory or embedded memory used in conjunction with a microcontroller, a microprocessor, or the like.

Figure 1:
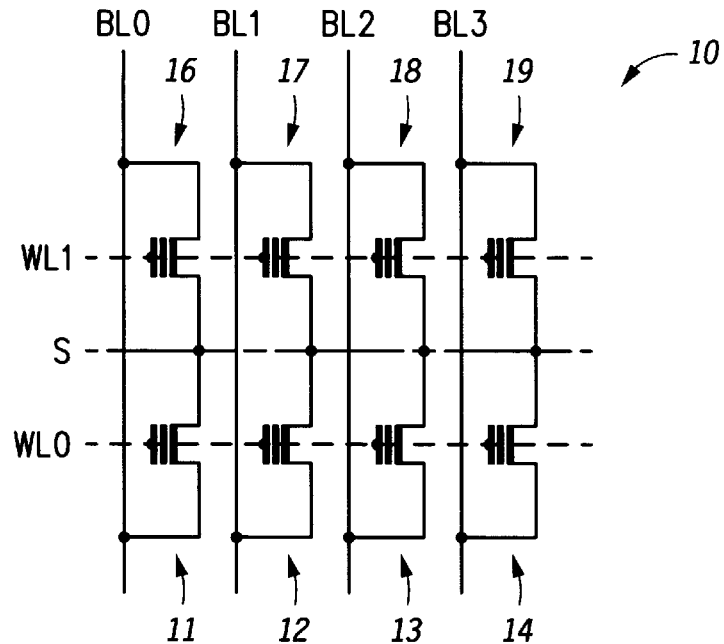
FIG. 1 includes a circuit schematic of a NOR-type flash memory array (prior art).
Figure 2:
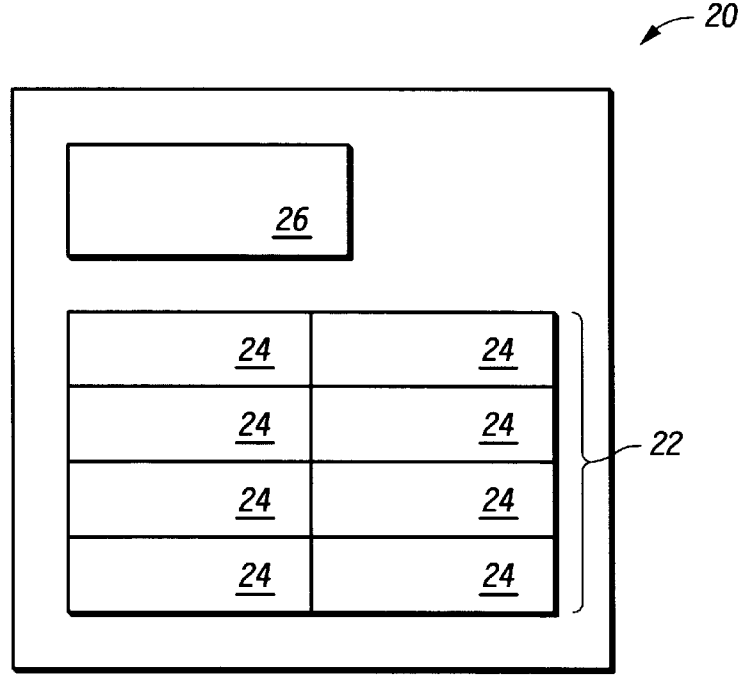
FIG. 2 includes an illustration of a block diagram of a memory module that includes an emulation block (prior art).

Embodiments of the present invention allow byte or word erase of memory cells within a memory array by allowing specific memory cells within the array to share a common source line. This benefit is provided without requiring the use of byte-select or word-select transistors in the memory cell array to support selective bit and byte eraseability. Furthermore, the added isolation transistors required for a 2T flash EEPROM cell are also not necessary using embodiments of the present invention. This reduces the number of transistors associated with each memory cell. Because fewer transistors are required to support operation of the memory cell, the overall size of the memory array can be made smaller. Additionally, the memory's design and layout does not require the EEPROM emulation block as shown in FIG. 2. Other advantages include that the memory cell's design can be incorporated without having to make complicated layout changes and that the memory's fabrication can be performed without having to develop elaborate or non-standard processing steps.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device having an electrically erasable programmable read only memory (EEPROM) array including tows and columns of memory cells comprising:

a first word line and a second word line substantially parallel to each other and extending in a first direction;

a first drain bit line, a second drain bit line, and a first source line, wherein:

each of the first and second drain bit lines and the first source line are substantially parallel to each other; and the first and second drain bit lines and the first source line extend in a second direction that is substantially perpendicular to the first direction;

a first source local interconnect that electrically connects the first source line and source regions of at least two memory cells within the EEPROM array, wherein:

the first source local interconnect has a length that extends from the first source line substantially in the first direction;

the at least two memory cells lie along a same row or column; and the first source local interconnect electrically connects only some, but not all, memory cells lying along the same row or column within the EEPROM array.

2. The semiconductor device of claim 1, wherein the first source local interconnect is electrically connected to four EEPROM memory cells.

3. The semiconductor device of claim 1, wherein the first source local interconnect is electrically connected to eight or nine EEPROM memory cells.

4. The semiconductor device of claim 1, wherein the first source local interconnect is electrically connected to sixteen or eighteen EEPROM memory cells.

5. The semiconductor device of claim 1, wherein:

the semiconductor device is capable of processing a word of data at a time, wherein the word consists of a first number of bits;

the first source local interconnect contacts source regions for only a second number of the memory cells; and the second number is twice the first number.

6. The semiconductor device of claim 5, wherein the first number of bits is eight bits.

7. The semiconductor device of claim 1, wherein each of the first and second word lines are connected to memory cells that contact a second source local interconnect that is different from the first source local interconnect.

8. The semiconductor device of claim 1, wherein:

the semiconductor device does not have an EEPROM emulation block; and the EEPROM array does not include any byte-select transistors.

9. The semiconductor device of claim 1, wherein the first source local interconnect extends over and lies within 50 nanometers of a field isolation region.

10. The semiconductor device of claim 1, the memory cells lie within a common well.

11. A method for erasing a first selected memory cell of an electrically erasable programmable read only memory (EEPROM) array within a semiconductor device, wherein the method comprises:

providing the semiconductor device having a minimum threshold tunneling potential, wherein the EEPROM array includes:

a selected drain bit line;

a selected source line electrically connected to at least one row or column, but not all rows and columns, of memory cells within the EEPROM array;

a first source local interconnect that contacts the selected source line and at least one, but not all, the memory cells electrically connected to the selected source line;

a selected word line extending in a direction substantially perpendicular to the selected source line;

an unselected drain bit line;

an unselected source line; and an unselected word line;

applying a first potential to a selected drain bit line;

applying a second potential to the selected source line, wherein the second potential is approximately equal to the first potential;

applying a third potential to a selected word line;

applying a fourth potential to an unselected drain bit line;

applying a fifth potential to the unselected source line, wherein the fifth potential is approximately equal to the fourth potential; and applying a sixth potential to an unselected word line, wherein:

a first potential difference between the third potential and any of the first and second potentials is greater than the minimum threshold tunneling potential;

a second potential difference between the third potential and each of the fifth and sixth potentials is less than the minimum threshold tunneling potential; and a third potential difference between the sixth potential and each of the first, second, fourth, and fifth potentials is less than the minimum threshold tunneling potential.

12. The method of claim 11, wherein:

the selected source line and the selected word line are substantially perpendicular to each other;.and the steps of applying the first to sixth potentials only erases memory cells lying along the selected word line and electrically connected to the first source local interconnect.

13. The method of claim 12, wherein:

the semiconductor device is capable of processing a word of data at a time, wherein the word consists of a first number of bits;

only the first number of memory cells are electrically connected to the selected word line and the first source local interconnect; and only the first number of memory cells are erased during the steps of applying the first to sixth potentials.

14. The method of claim 11, wherein:

the semiconductor device does not have an EEPROM emulation block; and the EEPROM array does not include any byte-select transistors.

15. The method of claim 11, wherein the first and second potentials have a first polarity and the third, fourth, and fifth potentials have a second polarity that is opposite the first polarity.

16. The method of claim 11, wherein the minimum threshold tunneling potential is approximately 10V.

17. The method of claim 11, wherein a potential range between the first potential and the second-potential is less than approximately one volt.

18. The method of claim 11, wherein:

the third potential inverts a channel region of an unselected memory cell along the selected word line; and the fourth and fifth potentials and a potential of the channel region of the unselected memory cell are within one volt of one another.

19. The method of claim 11, wherein an absolute value of the third potential is approximately 2–3 times higher than an absolute value of each of the first and second potentials.

20. The method of claim 11, wherein the third potential is approximately 3–5 times higher than each of the fourth and fifth potentials.

* * * * *